United States Patent
Muhammad et al.

(10) Patent No.: US 9,628,308 B2
(45) Date of Patent: Apr. 18, 2017

(54) CIRCUIT, COMMUNICATION UNIT AND METHOD FOR VCO FREQUENCY ADJUSTMENT

(71) Applicant: MEDIATEK INC., Hsin-Chu (TW)

(72) Inventors: Khurram Muhammad, Winston-Salem, NC (US); Dennis Mahoney, San Jose, CA (US)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 14/920,887

(22) Filed: Oct. 23, 2015

(65) Prior Publication Data

US 2016/0127160 A1  May 5, 2016

Related U.S. Application Data

(60) Provisional application No. 62/072,984, filed on Oct. 30, 2014.

(51) Int. Cl.
| | | |
|---|---|---|
| *H04L 27/28* | (2006.01) | |
| *H04L 27/00* | (2006.01) | |
| *H03L 7/197* | (2006.01) | |

(52) U.S. Cl.
CPC ........ *H04L 27/0014* (2013.01); *H03L 7/1976* (2013.01); *H04L 2027/0018* (2013.01); *H04L 2027/0055* (2013.01); *H04L 2027/0069* (2013.01)

(58) Field of Classification Search
CPC ....... H04L 7/033; H04L 27/2647; H03L 7/07; H03L 7/08; H03L 7/0891
USPC ............... 375/260, 267, 294, 327, 375, 376; 455/103, 127, 307; 331/16, 177 R
See application file for complete search history.

(56) References Cited

U.S. PATENT DOCUMENTS

| | | | |
|---|---|---|---|
| 6,850,749 B2 | 2/2005 | Soorapanth | |
| 2006/0209979 A1* | 9/2006 | Sandell | ............... H04L 27/2657 375/267 |
| 2011/0143697 A1 | 6/2011 | Verma | |
| 2013/0216014 A1* | 8/2013 | Kong | ....................... H03L 7/07 375/376 |

(Continued)

OTHER PUBLICATIONS

Hidaka, A 4-Channel 10.3Gb/s Transceiver with Adaptive Phase Equalizer for 4-to-41dB Loss PCB Channel, pp. 346-347 and a page including Figure 20.1.7, ISSCC 2011 / Session 20/ High-Speed Transceivers & Building Blocks / 20.1.

(Continued)

*Primary Examiner* — Khai Tran
(74) *Attorney, Agent, or Firm* — Optimus Patents US, LLC

(57) ABSTRACT

A circuit includes a frequency generation circuit having a phase locked loop, PLL, arranged to generate a carrier frequency; and a controller operably coupled to the frequency generation circuit and arranged to determine a frequency location of one or more signals output by the frequency generation circuit and provide a control signal thereto to adjust the carrier frequency generated by the frequency generation circuit. The controller is arranged to: cooperate with the PLL to introduce a frequency offset in the generated carrier frequency in a first frequency direction; and introduce a compensating frequency offset in a baseband transmit signal in a second frequency direction opposite to the first frequency direction.

19 Claims, 9 Drawing Sheets

(56) References Cited

U.S. PATENT DOCUMENTS

2015/0222415 A1* 8/2015 Chae .................. H03L 7/06
                                                      375/376

OTHER PUBLICATIONS

Chieh-Hsun Hsiad et al: "Design of a Direct Conversion Transmitter to Resist Combined Effects of Power Amplifier Distortion and Local Oscillator Pulling", IEEE Transactions on Microwve Theory and Techniques, IEEE Service Center, Piscataway, NJ, US, vol. 60, No. 6, Jun. 1, 2012 (Jun. 1, 2012), pp. 2000-2009, XP011445308, ISSN: 0018-9480, DOI: 10.1109/TMTT.2012.2193139*ii. Analysis Approaches-; figgure 4.

Mirzaei Ahmad et al; "21.8 A pulling mitigation technique for direct-conversion transmitters", IEEE International Solid State Circuits Conference, IEEE Service Center, New Your, NY, US, Feb. 9, 2014 (Feb. 9, 2014), pp. 374-375, XP032575099, ISSN:0193-6530, DOI: 10.1109/ISSCC.2014.6757476 ISBN: 978-1-4799-0918-6 [retrieved on Mar. 5, 2014] *col. 1, paragraph 1-paragraph 2; figure 21.8.2*.

* cited by examiner

CIRCUIT, COMMUNICATION UNIT AND METHOD FOR VCO FREQUENCY ADJUSTMENT

CROSS REFERENCE TO RELATED APPLICATIONS

This application claims the benefit of U.S. provisional application No. 62/072,984, filed on Oct. 30, 2014 and incorporated herein by reference.

BACKGROUND

1. Field of the Invention

The field of this invention relates to a circuit, a communication unit, and a method for adjusting a voltage controlled oscillator (VCO) frequency, and in particular to a circuit, a communication unit, and a method for pushing or load pulling a VCO frequency to avoid 4FMod spurious signals.

2. Description of the Prior Art

In telecommunications, there has been a recent trend for device manufacturers to design wireless communication units that are capable of operating over multiple frequency bands, to enable the same device to operate in different geographical regions, as well as being able to switch between different service providers and different communication technologies. All wireless/mobile phone communication devices that support communications on more than one channel use multiple frequencies.

Hence, in the field of Radio Frequency (RF) communication units, architectures for supporting communications across multiple and various frequencies have been developed. Typically, a single architecture is able to support multiple frequencies through provision of variable, programmable, frequency generation signals, for example for Long Term Evolution (LTE™) communication bands 13 and 26.

In LTE™, there are many types of signal configurations and some of the signal configurations have wide bandwidth and are centered on the carrier frequency; whereas other signal configurations are not. For example, in LTE™ uplink, signals with certain assigned resource block configurations can occupy frequency spectrum that is offset from the carrier frequency (in a similar manner to the known technique of Single Side Band (SSB) modulation). These signals can be similar to Continuous Wave (CW) tones that can be offset from the carrier frequency by as little as 180 kHz, which can be a significant offset for Phase Locked Loop (PLL) frequency pulling.

FIG. 1 illustrates a simplified block diagram of a basic PLL 100 comprising phase detector 110, loop filter 120, voltage controlled oscillator 130 and divider 140. The phase detector 110 compares input signal 105 with reference signal 106 output from the divider 140, to produce an error signal 107 that is proportional to the phase difference between signals 105 and 106. The loop filter 120 extracts the low frequency content of the error signal 107, which is input into the voltage controlled oscillator 130. The voltage controlled oscillator produces a change in its output signal 108 that is proportional to the error signal 107. The change in output signal 108 is also typically divided by a divider producing the reference signal 106. By feeding back this reference signal 106 into the phase detector 110, a closed loop system is formed that ensures the input signal 105 has the same phase as the reference signal 106.

In some instances, these signals can also be spaced almost 10 MHz away from the carrier. In such a case, harmonics of the modulated signals can inter-modulate with the desired signal in a Power Amplifier (PA) driver stage, thereby creating out-of-band spurious products. As illustrated in the simplified frequency response representation of FIG. 2, such out-of-band spurious products may include a primary 4FMOD spurious signal 210 that is due to an up-converted third harmonic of a baseband signal mixing with the Local Oscillator (LO) signal. A secondary 4FMOD spur may also be created, which is an image of the primary and is therefore much weaker. In frequency, the primary 4FMOD signal is always on the other side of the LO signal from the desired signal. If the frequency difference between the LO signal and the desired signal is denoted 'F', then the frequency difference between the desired signal 220 and the primary 4FMOD signal is 4F. The current known technique to avoid creating a problematic 4FMOD signal, as explained in US 2011/0143697 A1, is to modify the up-mixer to function as an harmonic rejection mixer.

Orthogonal Frequency Division Modulation (OFDM) in LTE20 creates up to one hundred Resource Blocks (RBs), each containing twelve subcarriers with 15 kHz spacing, spread over the channel bandwidth. For an RB with frequency offset $f_s$ from the Local Oscillator (LO), transmitter non-linearity causes counter-intermodulation (CIM) products at odd multiples of the frequency offset $f_s$: $-3f_s$, $+5f_s$, $-7f_s$, ... from the LO. These spurious signals, either directly or due to re-mixing due to Power Amplifier (PA) non-linearity, may fall on other frequency bands. For example, when a strong signal is present at the PA output 220 at an offset equal to (half) the bandwidth (BW) of PLL 230, very strong pulling 240 of the frequency occurs, and the PLL is much less effective in resisting it. A known solution to this problem is to increase the PLL BW. However, such a solution increases the output noise. The worst case is when one or just a few RBs are transmitted at the edge of the channel. CIM terms are first generated by mixers. For example, a Drive Amplifier (DA) placed after the mixers will cause these terms to be regenerated due to high-level harmonic sidebands. Counter Intermodulation problem is typically solved by use of harmonic reject mixer which will reduce the third harmonic at the input of the PA.

An oscillator is sensitive to its supply voltage. A change in supply voltage changes the output frequency, and is typically referred to as VCO frequency pushing. The output power at the PA causes significant current to flow between the supply voltage and ground. Some of this current flow changes the VCO supply, and this happens at the rate of modulation, which can be many MHz. In such a scenario, the PLL is unable to correct for it. A pushing factor is defined as the output frequency change in Hz per volts of supply voltage change (normally expressed as MHz/V).

In contrast, a pulling factor of a VCO quantifies its susceptibility to output load variations. This is a slow process and typically the PLL can act fast enough to correct for this impairment. If the output load changes, the oscillator frequency changes in response. A variation of the output load of the VCO changes its Voltage Standing Wave Ratio (VSWR) performance, as well as the return loss. In some examples, the pulling factor may be minimized by using a buffered output. Typically, analog circuits adjust the oscillator's supply voltage are used to combat PLL pulling. VCO pushing degrades the output spectrum and is typically solved by increasing the PLL BW or reducing the magnitude of perturbation of VCO supply due to output.

There is a general need for concepts to avoid Radio Frequency (RF) impairments, particularly with relation to LTE carrier frequencies and problems associated with VCO pushing and/or 4Fmod.

SUMMARY

Accordingly, the invention seeks to mitigate, alleviate or eliminate one or more of the above mentioned disadvantages, either singly or in any combination. Aspects of the invention provide a wireless communication unit, an integrated circuit and a method therefor, as described in the appended claims.

According to a first aspect of the invention, a circuit is described that comprises a frequency generation circuit comprising a phase locked loop (PLL) arranged to generate a carrier frequency; and a controller operably coupled to the frequency generation circuit and arranged to determine a frequency location of one or more signals output by the frequency generation circuit and provide a control signal thereto to adjust the carrier frequency generated by the frequency generation circuit. The controller is arranged to: cooperate with the PLL to introduce a frequency offset in the generated carrier frequency in a first frequency direction; and introduce a compensating frequency offset in a baseband transmit signal in a second frequency direction opposite to the first frequency direction.

According to an optional example, the circuit may comprise a baseband circuit operably coupled to the controller and the baseband transmit signal is a digital baseband transmit signal and the controller introduces the frequency offset in the generated carrier frequency by sending a digital control signal to the frequency generation circuit.

According to an optional example, the controller may determine the frequency offset in the generated carrier frequency based on at least one of: output power level of a transmit signal, a knowledge of how far the PLL is able to push the generated carrier frequency.

According to an optional example, the controller may introduce a frequency offset that is substantially a smallest offset that can be tolerated such that the PLL is able to pull the carrier frequency plus offset and still reduce interference into an adjacent frequency band.

According to an optional example, the introduced frequency offset may be selected by the controller to perform at least one of: reduce 4Fmod interference to an acceptable power level by selecting an adjacent frequency band for the carrier frequency, move 4Fmod interference in-band of the frequency generation circuit.

According to an optional example, the introduced frequency offset may be selected by the controller to reduce 4Fmod interference in Band 13 of LTE™ to an acceptable power level by selecting an adjacent frequency band for the carrier frequency.

According to an optional example, the controller may be further arranged to determine whether a difference of a center frequency of the generated carrier frequency is less than the introduced frequency offset for a selected band and configured radio bearer such that pushing occurs.

According to an optional example, the controller may comprise a fast fourier transform function arranged to evaluate a phase error signal of the PLL in at least one of a time domain, a frequency domain.

According to an optional example, the controller may be arranged to relocate at least one radio bearer based on the evaluated phase error signal.

According to an optional example, the controller may be arranged to: determine a location of a plurality of frequencies generated by the frequency generation circuit; determine one or more frequencies, from the plurality of frequencies, where pushing occurs; and, in response thereto cause an adjustment of the generated one or more frequencies to a higher frequency than the generated carrier frequency with a frequency offset.

According to an optional example, the controller may be configured to translate a baseband spectrum to an intermediate frequency (IF) to introduce the compensating frequency offset, whilst applying a frequency offset to shift the generated carrier frequency in an opposite direction by the same IF.

According to an optional example, the controller may be configured to introduce a frequency offset in the generated carrier frequency in a first frequency direction by use of two-point modulation.

According to an optional example, the frequency generation circuit may comprise a digitally controlled oscillator (DCO) and the frequency generation circuit may further comprise a sigma-delta modulator, such that a first point of the two-point modulation is applied at a DCO input and a second point of the two-point modulation is applied at an input of the sigma-delta modulator.

According to an optional example, the frequency generation circuit may further comprise a fast fourier transform (FFT) module operably coupled to the PLL and configured to evaluate a phase error signal within the PLL.

According to an optional example, the FFT module may be configured as a time domain power estimate to estimate a variance of an error signal in a time window of a signal applied to the FFT module.

According to an optional example, the FFT module may be configured to provide an indication of error signal power of frequency components of signals contained within the PLL.

According to an optional example, the controller may be configured to introduce a frequency offset in the generated carrier frequency in a first frequency direction by use of one-point modulation by applying a frequency input to a sigma delta modulator located within the PLL.

According to a second aspect of the invention, a wireless communication unit comprises a frequency generation circuit comprising a phase locked loop (PLL) and arranged to generate a carrier frequency; and a controller operably coupled to the frequency generation circuit and arranged to determine a frequency location of one or more signals output by the frequency generation circuit and provide a control signal thereto to adjust the carrier frequency generated by the frequency generation circuit. The controller is arranged to: cooperate with the PLL to introduce a frequency offset in the generated carrier frequency in a first frequency direction; and introduce a compensating frequency offset in a baseband transmit signal in a second frequency direction opposite to the first frequency direction.

According to a third aspect of the invention, a method for frequency generation by a frequency generation circuit comprising a phase locked loop (PLL). The method comprises: generating a carrier frequency; determining a frequency location of one or more signals output by the frequency generation circuit; providing a control signal to the frequency generation circuit to adjust the carrier frequency generated by the frequency generation circuit; cooperating with the PLL to introduce a frequency offset in the generated carrier frequency in a first frequency direction; and introducing a compensating frequency offset in a baseband transmit signal in a second frequency direction opposite to the first frequency direction.

These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGs are illustrated for simplicity and clarity and have not necessarily been drawn to scale.

DETAILED DESCRIPTION

Figure 1:
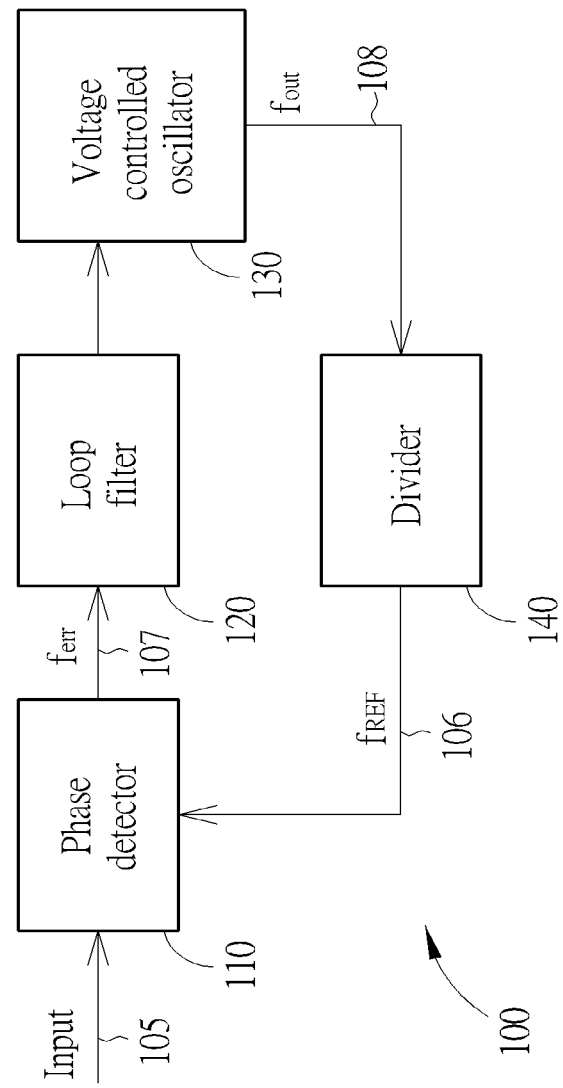
FIG. 1 illustrates a simplified block diagram of a known basic Phase locked loop (PLL).
Figure 2:
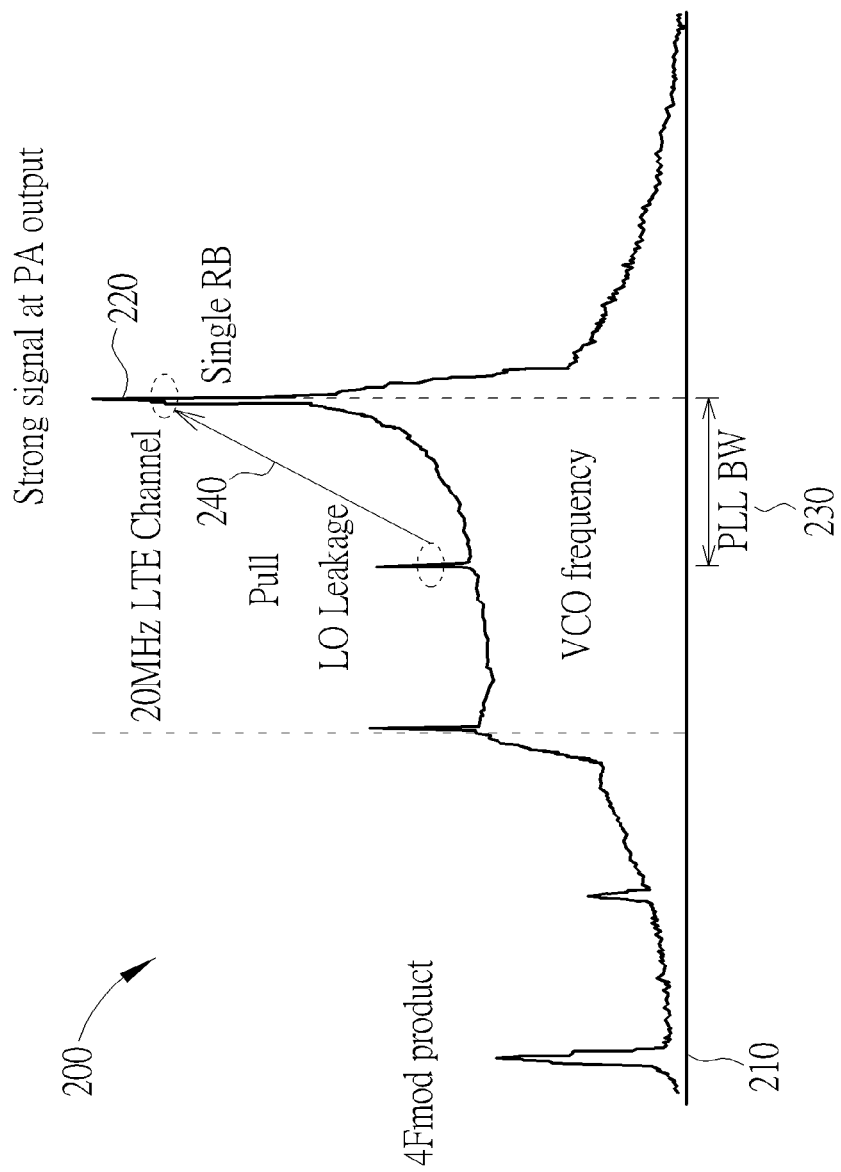
FIG. 2 illustrates a simplified frequency response representation of 4FMod problem with a PLL.

Examples of the invention will now be described with reference to an example implementation to avoid RF impairments, say on LTE carrier frequencies, by shifting both the digital baseband (DBB) signal and the local oscillator (LO) by a corresponding offset amount. In this manner, one or more of the aforementioned problems associated with the creation of a 4Fmod spurious signal and spectral degradation due to pushing of the VCO may be alleviated. In example embodiments of the invention, the introduction of a frequency offset, in a generated carrier frequency in a particular frequency direction, encompasses a phase locked loop (PLL) being able to pull or change or translate the generated carrier frequency. Henceforth, the term 'frequency adjust' may be considered as encompassing all such actions.

Some telecommunications standards, such as Wireless Local Area Network (WLAN™) provide sufficient time to allow the PLL to re-lock following a shifting of both the DBB signal and the LO by a corresponding offset amount. However, in LTE™, the re-lock time is approximately 35 us. In this situation, a fast locking PLL is required. An all-digital PLL may be able to lock in this time by employing gear-shifting. However, traditional analog PLLs are unlikely to be able to lock in such a time period. Thus, in some examples, the shifting both the DBB signal and the LO by a corresponding offset amount may result in difficult design considerations in order to ensure that the PLL re-locks within a short time span. The phase at the output of the PLL may also change from the reference. In such a case, the phase may also need to be checked and compensated for, for example if the standard requires the phase to have no more than a limited amount of frequency jump. Hence, in some examples, a 2-point modulation approach may be adapted to bypass the PLL pulling (i.e. frequency readjust by the PLL operation in order to fight 'VCO pushing') effect due to the concurrent offsets applied to the DBB signal and the LO.

In examples of the invention, a concept of 'PLL pulling' is described, which encompasses a mechanism by which a PLL readjusts an input to a loop filter so that the output frequency returns to what is desired by a multiplier, such as a $F_{REF}$*multiplier. This 'PLL pulling' term should not be mistaken for 'VCO pulling' (sometimes referred to as 'load pulling'), which is related to VCO frequency movement due to load changes that are typically addressed by the PLL.

Examples of the invention propose a mechanism to determine an acceptable or best frequency offset (FO) for a VCO frequency with respect to an output power level of a power amplifier (PA). One way to determine an acceptable or the best frequency, and perhaps the simplest way, is to always keep the radio bearers (RBs) as far from the LO frequency as possible. However, the inventor of the present invention has recognised and appreciated that this can cause 4Fmod problems, for example in band 13 of LTE™. In frequency spectrum scenarios such as may be found in band 13 of LTE™ with potential 4Fmod problems, examples of the invention may be used to determine how far away from the VCO frequency the RBs should be placed for the PLL not to be affected by the output of the power amplifier (PA), for example when operating at a maximum transmit output power (Pmax). That is, a controller in examples of the invention may select the smallest offset that can be tolerated where the PLL can withstand pushing due to RBs at 23 dBm output power to avoid causing 4Fmod interference into an adjacent frequency band, such as public safety band from band 13 of LTE™.

Furthermore, because the illustrated examples of the present invention may for the most part, be implemented using electronic components and circuits known to those skilled in the art, details will not be explained in any greater extent than that considered necessary as illustrated below, for the understanding and appreciation of the underlying concepts of the present invention and in order not to confuse or distract from the teachings of the present invention.

Examples of the invention describe a circuit comprising: a frequency generation circuit comprising an oscillator and a phase locked loop, PLL, and configured to generate a carrier frequency. A controller is operably coupled to the frequency generation circuit and arranged to determine a frequency location of one or more signals output by the frequency generation circuit and provide a control signal thereto to adjust the carrier frequency generated by the frequency generation circuit. The controller is configured to cooperate with the PLL to introduce a frequency offset in the generated carrier frequency in a first frequency direction; and introduce a compensating frequency offset in a baseband transmit signal in a second frequency direction opposite to the first frequency direction. In some instances, it is understood that that the term 'PLL' may sometimes be considered as encompassing the oscillator as part of the PLL. In some instances, it is also understood that the term 'PLL' may sometimes be considered as the PLL providing a control system that incorporates a feedback path from the output of the oscillator to the input, and as such may sometimes be considered as not comprising the oscillator. It is envisaged that both of these possible interpretations are to be covered in the description and claims and that the different interpretations can be used interchangeably.

Figure 3:
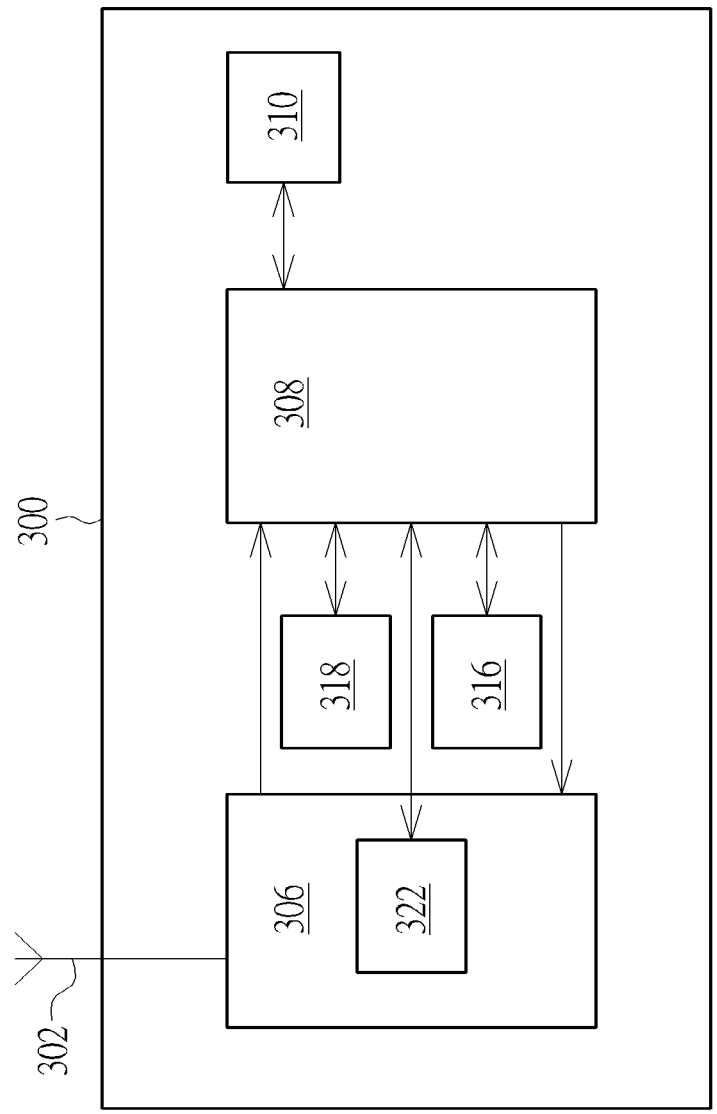
FIG. 3 illustrates an example block diagram of part of an electronic device employing a frequency generation circuit comprising a PLL.

Referring to FIG. 3, there is illustrated an example of a simplified block diagram of part of an electronic device 300 adapted to support the inventive concepts of an example of the present invention. The electronic device 300, in the context of the illustrated example of the invention, is a wireless communication unit such as a mobile telephone handset comprising an antenna 302. The communication unit 300 contains a variety of radio frequency components or circuits 306, operably coupled to the antenna 302 that will not be described further herein. The radio frequency circuits comprise a frequency generation circuit 322, which in the described example comprises a PLL and a charge pump as will be described in greater detail below. The communication unit 302 further comprises controller 308. An output from the controller 308 is provided to a suitable user interface (UI) 310 comprising, for example, a display, keypad, microphone, speaker, etc.

For completeness, the controller 308 is operably coupled to a memory 316 that stores operating regimes, such as decoding/encoding functions and the like and may be realised in a variety of technologies such as random access memory (RAM) (volatile), (non-volatile) read only memory (ROM), Flash memory or any combination of these or other memory technologies. A timer 318 is typically coupled to the controller 308 to control the timing operations within the communication unit 300.

In accordance with examples of the invention, the controller 308 comprises, inter-alia, at least one digital baseband processor adapted to co-operate with frequency generation circuit 322. In some examples, the controller 308 cooperates with a Phase Locked Loop (PLL) and determines (or is informed, for example by accessing a look up table or memory 316) that a certain transmitter output power will push a frequency, generated by, say, a voltage controlled oscillator (VCO) or digitally controlled oscillator (DCO) within frequency generation circuit 322, a given frequency distance. This information may be pre-stored in memory 316 or may be determined through calibrating the operation of the transmitter chain and frequency generation circuit 322. For example, with knowledge of how much a generated carrier frequency may be pushed in response to a particular transmit output power, the controller 308 may then be able to avoid the generated carrier frequency being pushed too far by pre-shifting the carrier frequency. In some examples, the pre-shifting of the carrier frequency may be based on the transmit output power, and may be dependent upon knowledge of how to use a PLL most effectively to combat VCO or DCO pulling. In some examples, the controller 308 may introduce a frequency offset in the generated carrier frequency in a first frequency direction; and introduce a compensating frequency offset in a baseband transmit signal in a second frequency direction opposite to the first frequency direction.

In addition, for example in response to the controller 308 knowing that a certain transmit output power will push the carrier frequency generated by the VCO or DCO a given frequency distance in a particular direction away from the center of the nominal frequency band, the controller 308 may also be able to provide a control signal to the frequency generation circuit 322 in order to set (locate) one or more potential intermodulation product(s) generated by the frequency generation circuit 322. For example, the control signal applied by the controller 308 to set a carrier frequency output of the frequency generation circuit 322 may be configured to reduce or minimise a potential intermodulation product, such as a 4Fmod product. In this manner, the reduction or minimising of such a potential intermodulation product may be such that the output frequency spectrum does not create an emission specification violation.

In some examples, this approach may be digital only, whereby the generated VCO or DCO carrier frequency is configured such that the transmit output power is at a frequency offset where the PLL is effective enough in combating the imposed offset, and yet ensuring that any potential intermodulation product (such as an 4Fmod product) falls in-band or at an offset where its power level is acceptable. In some examples, the frequency determination of the signal components may be made by an algorithm in controller 308. In this manner, controller 308 may determine whether intermediate frequency (IF) translation is needed, and by how much amount it should be frequency adjusted (e.g. translated). The guiding principle of examples of the invention is to keep single RBs away from where the PLL has difficulty combating them.

One design option could be to increase the PLL bandwidth (BW) in order to help alleviate VCO pulling. However, such an increase in the PLL BW reduces the rejection of noise, which then appears in the output spectrum and can cause violation of output noise spec. In certain transmit configurations, when single RBs are placed where the VCO or DCO will be pushed, but where the PLL will not be able to combat the pushing, it is proposed that the baseband spectrum may be translated to an IF frequency, whilst shifting the VCO output in the opposite direction by the same IF frequency. The frequency offset is determined based on the transmit signal configuration.

Instead of re-locking the PLL, some examples propose use of two-point modulation in order to perform a fast shift of the local oscillator frequency, for example in less than 1 us, without disturbing the PLL. Thus, although the transmit output is still at the same carrier frequency, the VCO or DCO frequency and the baseband IF frequency are now placed such that the PLL can combat VCO or DCO pulling. Also, in some examples, the IF frequency uses a frequency offset (FO) that places the 4Fmod product in-band or at an offset where no violation occurs for emission spectrum.

Figure 4:
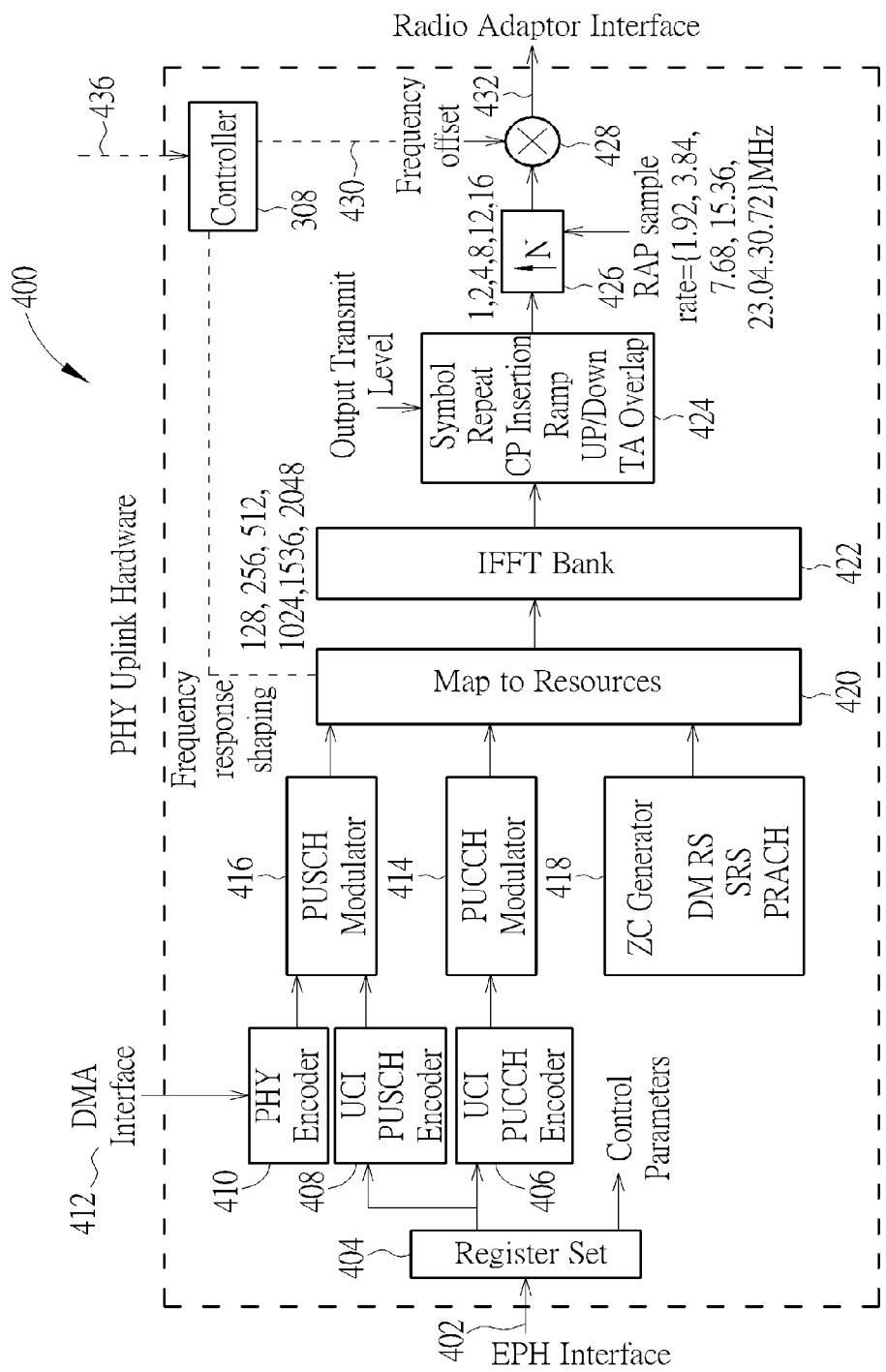
FIG. 4 illustrates an example block diagram of a digital baseband processing operation according to examples of the present invention.

Referring now to FIG. 4, there is illustrated a circuit diagram 400 of an example hardware implementation of a physical layer uplink transmission circuit, for example as located within controller 308 of FIG. 3. The circuit diagram 400 comprises an input signal for transmission over an EPH interface that is provided to register set 404. Register set 404 outputs control parameters and the transmission signal for formatting. The transmission signal is provided to Uplink Control Information (UCI) Physical Uplink Shared Channel (PUSCH) encoder 408 and Uplink Control Information (UCI) Physical Uplink Control Channel (PUCCH) encoder 406, which respectively encode their received data into a suitable format. The control information output from UCI PUCCH encoder 406 is provided to PUCCH modulator 414, which modulates the control information in the appropriate format. The transmission data output from UCI PUSCH encoder 408 is provided to PUSCH modulator 416, which also modulates the data in the appropriate format. Data is also extracted from Direct Memory Access (DMA) via DMA interface 412 and provided to physical encoder 410, which encodes the data and forwards the encoded data to PUSCH modulator 416.

In one example, the mapped resource, for example in a form of a mapped encoded symbol stream output from the mapping function 420, is input to an Inverse Fast Fourier Transform (IFFT) function 422. The IFFT function 422 performs an inverse fast Fourier transform operation on the encoded symbol stream, thereby converting it from the frequency domain to the time domain in order to generate an encoded time domain signal for transmission. Reference signals to estimate uplink quality are handled in PUSCH modulator in 416. This information is appropriately mapped to RBs and converted to a single carrier frequency division multiple access (SC-FDMA) format within IFFT function 422 followed by, say, cyclic prefix (CP) insertion in data formatter 424, respectively. Additional functions are also supported by data formatter 424 relevant to LTE™ signalling. The output transmission is input to up-mixer 428, where it is multiplied with the LO comprising frequency offset 430 in order to produce a modulator output signal 432 for final amplification and routing to an antenna (not shown).

The sampling rate is adjusted in rate adjuster 426 and a frequency offset can be applied in 428 through the signal 436 applied to controller 308.

Thus, FIG. 4 illustrates one example embodiment of a modulator that embeds IF translation that places desired RBs anywhere in the output spectrum instantaneously. In particular, examples are described that place the output RBs at frequencies such that their offset from the LO frequency is close to the BW of the PLL, for example in a subsequent radio frequency integrated circuit (RFIC) (not shown). This causes frequency pushing and impacts the output spectrum of the PLL frequency output (LO).

In accordance with examples of the invention, a digital Intermediate Frequency (IF) offset (in one direction) may be introduced in the digital baseband (DBB) circuitry, specifically in controller 308 in this example. In some examples, an IF frequency of the baseband transmit signal is offset when the controller (or other circuit) determines that a resultant 4Fmod signal may be violating the wireless communication unit's emission spectrum. In order to address this violation, the IF frequency of the baseband transmit signal may be converted to zero IF (or zero-IF like) in order to shift the 4Fmod product to be in-band. In this manner, the need for a harmonic reject mixing is no longer required in order to meet emission spectrum requirements.

Therefore, in this example and in this manner, the controller 308 modifies the IF frequency offset 430 applied to up-mixer 428 in order to move the RBs away, such that these do not affect the PLL. In case of 4Fmod compensation, the smallest offset is selected such that the 4Fmod product falls in-band whilst the offset between LO and PA output is maximized.

In this example, the digital IF offset is implemented in a mapping function 420, for example located within controller 308 of FIG. 3. In some examples, mapping function 420 maps the input modulated control and data to resource blocks. In some examples, the amount of digital offset may be controlled by a controller 308 (which may in some examples comprise a signal processor or signal processing functionality (not shown), as illustrated.

In example implementations that comprise of two integrated circuits (or 'chips' as they may be referred to), such as a digital baseband (DBB) and a RFIC, the DBB may not have the ability to modify sufficiently the IF frequency by a desired offset. Therefore, in such a scenario, IF translation may be necessary to combat VCO pushing using a subsequent mixing stage (not shown).

In some examples, the modulator output signal 432 may be input to a subsequent RFIC (not shown) that contains, for example, digital to analog (D/A) conversion, further up-mixing and a PA driver. The PA driver provides the driving signal to an external PA that causes frequency pushing/pulling to the PLL in the RFIC that feeds LO to the up-conversion mixers. The RFIC may contain a Digital Front End (DFE) to perform further signal conditioning, such as digital sampling rate conversion to match input sampling rate to D/A converters, LO feed-through and/or IQ mismatch compensation(s) in addition to other potential compensators, such as adaptive PA predistortion.

In some alternative examples, the offset for IF translation in order to combat frequency pushing may be made known to a further hardware device embedded in the DFE of the Radio Frequency Integrated Circuit (RFIC) (not shown) and allow the RFIC to apply the frequency shift (such as via frequency offset 430) to a Local Oscillator (LO) to be applied to the up-mixer 428. In this example, a second IF translation stage is needed in the RFIC that is controlled together with the PLL. A controller (which may be a further controller or controller 308 from FIG. 3) and a further digital up-mixer are needed in RFIC and may be controlled from the DBB to instruct any necessary IF translation in order to avoid PLL pushing. Notably, in this example, the needed frequency shift is applied in the frequency domain (i.e. in the PLL as will be explained subsequently) in the opposite direction to the same (digital) offset applied in the IF translator of the RFIC, such the PA output stays at the same frequency. The amount of frequency shift introduced with the digital IF offset, for example in the RFIC, depends on whether the further controller or controller 308 is aiming to address a 4Fmod issue or a PLL pushing/pulling issue. Thus, in some examples of the invention, the offset may be controlled via control input 436, which is modified to instruct the RFIC to use IF translation in order to combat these analog impairments.

Notwithstanding the manipulation of the frequency offset amount, in some examples the latency in the digital path and PLL path may be also matched such that the LO changes very closely in time to when the up-mixer 428 receives a frequency translated input. In some examples, the phase shift in the PLL output may be controlled using two point modulation, such that the output phase shift is within the specification. In some examples, when a 4Fmod issue occurs, PLL pushing/pulling is not a concern, as the RBs are far away from the VCO center frequency.

Figure 5:
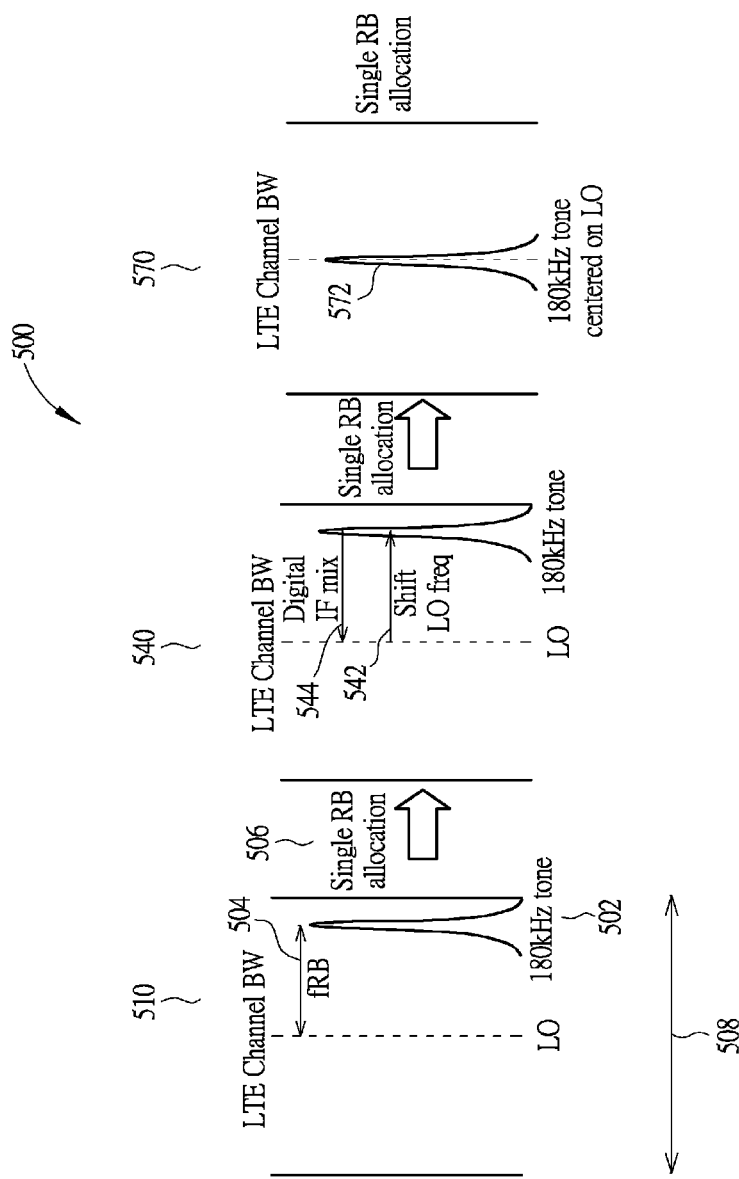
FIG. 5 illustrates a simplified frequency response representation of frequency adjustments to mitigate a potential 4FMod problem with a single radio bearer.

Referring now to FIG. 5, an example frequency response 500 illustrates a representation of some of the frequency adjustments performed by examples of the invention, for example with respect to the circuit diagram 400 of FIG. 4. The example frequency response 500 addresses a scenario whereby the controller 308 aims to shift the VCO frequency to solve either 4Fmod problem or VCO pushing problem, depending on the offset $f_{RB}$ 504 of the RB from the LO.

The example frequency response 500 comprises a representation 510 of a radio bearer (RB) of a 180 KHz tone 502 being located at a frequency distance 504 within the LTE™ channel bandwidth 508 away from the LO center frequency. In response to the radio bearer (RB) of a 180 KHz tone 502 being shifted by a frequency 504 within the LTE™ channel bandwidth 508, adjustment of the single RB 506 is performed and illustrated in representation 540. In representation 540, in order to bring the RB back on track, the frequency adjustment incorporates a reduction of the 180 KHz tone by a frequency distance 504 through adjustment (reduction) of a digital intermediate frequency (IF) 544. In one example, the adjustment of the digital IF 544 may be achieved by applying a digital offset to the mapping function 420 of the DBB circuit of FIG. 4. Alternatively, in another example, the adjustment of the digital IF 544 may be performed in an RFIC digital mixer element (for example following up-mixer 428 of FIG. 4). In addition, the LO frequency is also shifted 542 (in this case increased) by the same frequency distance 504, in order to counteract the direction introduced by the reduction in the digital IF 544. Representation 570 then illustrates the results of the aforementioned frequency adjustments, which is a centering 572 of the RB 180 KHz tone on the center frequency of the LTE™ channel bandwidth 508. If frequency distance 504 is close to the PLL BW setting for which the LO meets the output noise requirements with good current consumption, the PA output will push the PLL. In this case the LO frequency is adjusted to make a zero-IF transmitter (i.e. where the LO is arranged to be the center frequency of the PA output), thereby allowing the PLL to combat VCO pushing. There is no 4Fmod problem in a zero-IF transmitter.

Alternatively, in another example, the controller 308 may arrange for the tone to be shifted further away, such that the offset between the LO and PA output center frequency is increased and pushing disappears. However, this case where the frequency offset large is instructive for a situation where the 4Fmod problem appears. Here, in some examples, the frequency offset may be decreased to zero in order to let the PLL take care of it as it is within the PLL BW. In general, the best approach is to keep the frequency offset between LO and PA output center frequency as large as needed, such that no pushing occurs. In the extreme case, it can always be set to maximum allowed separation. In case of Band 13, this default solution can create 4Fmod problem which is solved by selecting the offset to be the smallest such that pulling does not occur.

Figure 6:
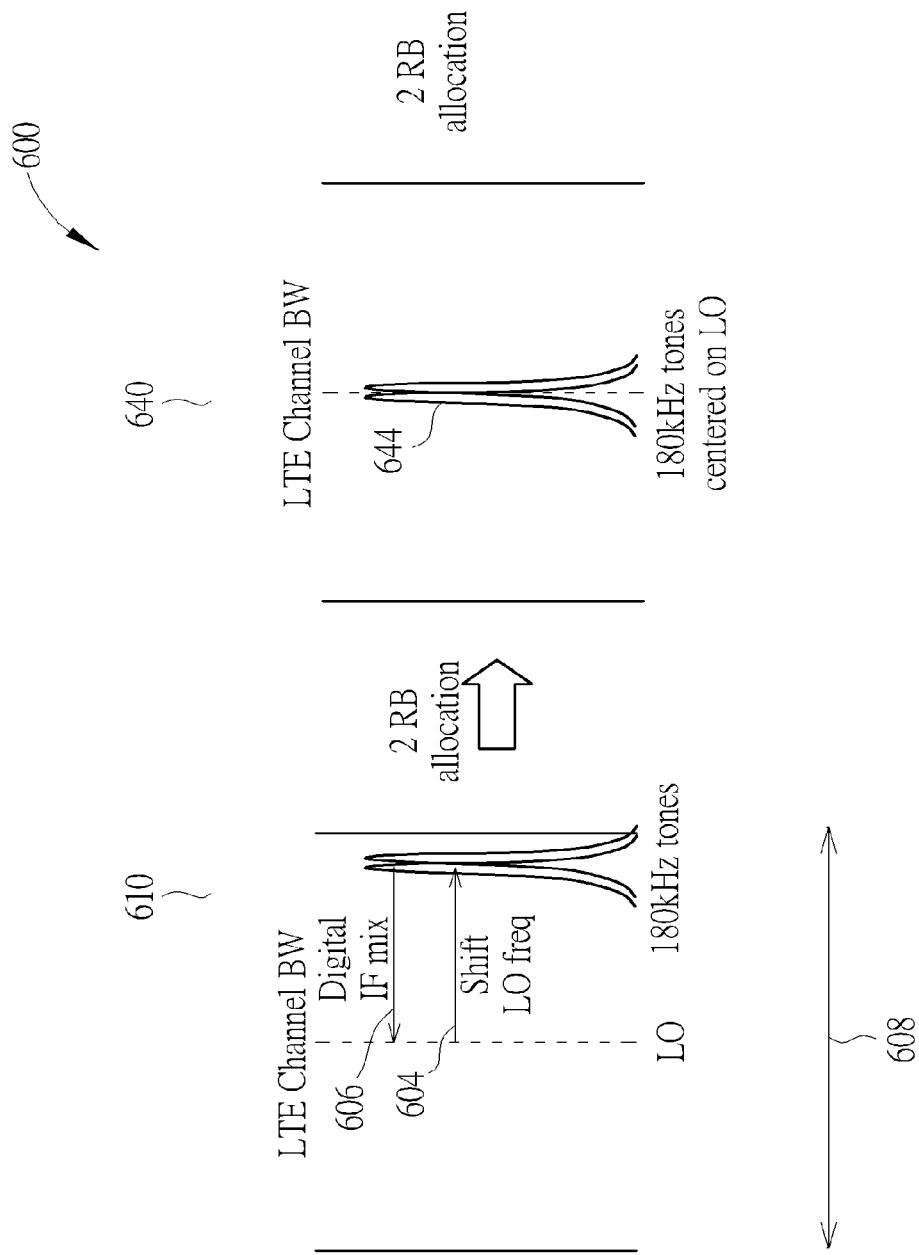
FIG. 6 illustrates a simplified frequency response representation of frequency adjustments to mitigate a potential 4FMod problem with multiple radio bearers.

Referring now to FIG. 6, there is illustrated an example frequency response 600 of an asymmetric configuration of multiple RBs, for example with a two RB implementation. In this example, multiple RBs may be concurrently shifted, such that the LTE™ spectrum is centered on the LO. Again, the example frequency response 600 may represent some of the frequency adjustments performed by examples of the invention, for example with respect to the circuit diagram 400 of FIG. 4. The example frequency response 600 again addresses a scenario whereby the controller 308 aims to pull the VCO frequency to a centered LO frequency, thereby converting the transmitter to a zero-IF transmitter and inherently addressing a 4Fmod problem. The example frequency response 600 comprises a representation 610 of two RBs having tones around 180 KHz 602 away from the center frequency of the LTE™ channel bandwidth 608. In response to the two RBs having tones around 180 KHz 602 away from the center frequency, adjustment of the two RBs 606 is performed via an adjustment (reduction) of a digital intermediate frequency (IF) 606 and a corresponding LO adjustment (increase) 604. In one example, the adjustment of the digital IF 606 may be achieved by applying a digital offset to the mapping function 420 of the DBB circuit of FIG. 4. The LO frequency is also shifted 604 by the same frequency, in order to counteract the direction introduced by the reduction in the digital IF 606, for example in this illustrated example by increase of the LO frequency. Representation 640 then illustrates the results of the aforementioned frequency adjustments, which is a centering 644 of the two RBs on the center frequency of the LTE™ channel bandwidth 608. If the 4Fmod problem is not an issue in a particular band of operation, it is recommended in some examples to just shift the LO to a much larger offset such that no pushing occurs.

In some examples, for example to mitigate the effects of the 4Fmod product, a new location of RBs may be determined such that the 4Fmod product falls in-band, or at least at an acceptable frequency. The 4Fmod product falling in-band is governed by an 'in-band' emission spectrum specification, rather than the stringent emission specification, such as for the public safety band. With just a few RBs (for example up to four RBs), it is possible to create zero-IF transmission with a PLL BW of about 500 kHz and let the PLL combat the frequency pushing/pulling.

In examples where there are more than a few RBs, examples of the invention propose avoiding the pushing/pulling problem altogether by shifting the LO to higher than the frequency offset where pushing is observed. In this manner, no pushing/pulling of the VCO is created. That is, the digital offset is introduced to place the RB(s) either within the PLL BW or away from it. If the digital offset is introduced to place the RB(s) away from the PLL BW (e.g. $f_{RB}$>PLL BW), then the RB frequency should be carefully selected to ensure that the 4Fmod image avoids adjacent, critical frequency bands, such as the Public safety band with respect to an LTE™ system. In accordance with some examples of the invention, selecting the smallest separation that does not create pushing may be the best or optimum approach although that offset may need to be determined for each band and, for example, stored in a LUT for reference. This ensures that the 4Fmod product falls in-band whilst the separation is large enough for pushing not to be an issue. Alternatively, examples of the invention may select the offset to be the largest separation for all bands other than band-13.

Figure 7:
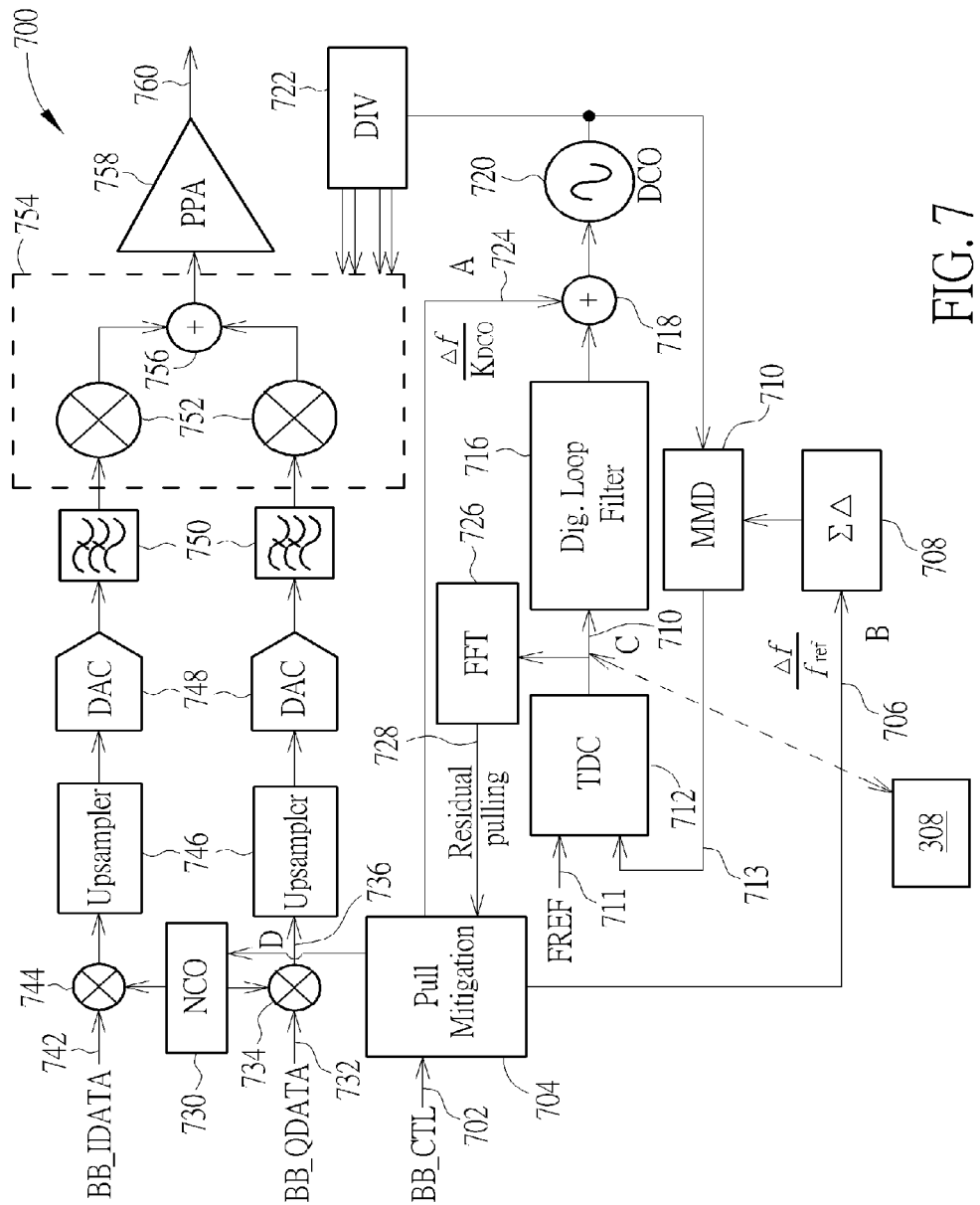
FIG. 7 illustrates an example block diagram showing a charge pump and frequency adjustment operation according to examples of the present invention.

Referring to FIG. 7, there is illustrated an example block diagram of a circuit 700 of a more detailed representation of an example transmitter and charge pump circuit. In some examples, circuit 700 may form at least part of a radio frequency integrated circuit. The transmitter comprises quadrature baseband inputs BB_Qdata 732 and BB_Idata 742, which are passed to respective quadrature up-mixers 734, 744. A Numerically Controlled Oscillator (NCO) 730 provides digital signals to the respective quadrature up-mixers 734, 744, to apply a respective digital offset to the baseband signals. The NCO 730 is a timer that uses the overflow of an accumulator to create an output signal. The accumulator overflow is controlled by an adjustable increment value, rather than just a single clock pulse or post-scaler increment. This offers an advantage over a simple timer driven counter in that the resolution of division does not vary with the somewhat limited prescaler/post-scaler divider value. In this example, an NCO 730 is used to provide frequency accuracy and fine resolution at a fixed duty cycle.

The baseband signals with a respective digital offset applied by the NCO 730 and output from respective quadrature up-mixers 734, 744 are input to quadrature upsamplers 746, which provides upsampled representations of the digital signals to digital-to-analog converters (DACs) 748. The DACs 748 convert the upsampled representations of the digital signals to analog form, and the analog representations of the quadrature baseband inputs BB_Qdata 732 and BB_Idata 742 are input to a frequency up-conversion circuit 754. The frequency up-conversion circuit 754 comprises respective quadrature up-mixers 752, which receives the filtered analog representations of the quadrature baseband inputs BB_Qdata 732 and BB_Idata 742 and the quadrature local oscillator signals, and outputs radio frequency signal versions of the quadrature baseband inputs BB_Qdata 732 and BB_Idata 742. The outputs from the quadrature up-mixers 752 are combined in summer 756 and the combined output provided to a power amplifier chain 758, which amplifies the RF signals to produce a high-power RF signal 760 that is representative of the quadrature baseband inputs BB_Qdata 732 and BB_Idata 742.

A known technique to support a wide frequency band is to split the required frequency tuning range of a controlled oscillator into discrete bands. One advantage of having many bands is that a wide tuning range can be covered whilst maintaining a relatively low voltage-controlled oscillator (VCO) gain within each band. Low VCO gain is good for achieving low VCO phase noise. In such architectures, the frequency bands overlap. As illustrated, the oscillator with discrete tuning bands is used in a phase-locked loop (PLL), where the desired band must be selected before the PLL can proceed to phase lock. The tuning bands are changed with a digital band control signal 702, which is input to pull-mitigation module 704.

In accordance with examples of the invention, a digital only approach is adopted whereby a digital offset 'D' is applied to NCO 730 and a comparable, but opposing frequency offset applied to the frequency up-conversion circuit 754. The digital offset 'D' applied to NCO 730 is provided by pull-mitigation module 704. The pull-mitigation module 704 is arranged to relocate the LO such that the signal is centered. In this regard, KDCO needs to be accurate and is therefore frequently estimated.

In this example, the pull-mitigation module 704 is part of a PLL charge pump circuit that is configured to employ two-point modulation to shift the LO signal in the frequency domain. If KDCO is accurately known, two-point modulation can be used to move (or translate) the LO back and forth as needed. Kdco is the gain of the DCO 720 in Hz/LSB. That is, when the least significant bit (LSB) capacitor is increased, a determination of how much the frequency is reduced can be made. The change in the gain of the DCO 720 can be stated as:

$$Kdco = -2*pi^2*L*fo^3*\Delta C \text{ Hz/LSB}. \quad [1]$$

So, if the output frequency is required to be changed by a particular amount, the input is normalized by Kdco.

In an LTE™ system, 40 us periods are provided at the slot boundaries in LTE subframes, These 40 us periods may be used to fast lock the PLL to the offset frequency. The maximum adjustment for an LTE device is ~20 MHz, which needs to be achieved in ~30 us to 35 us, which is very challenging for a standard PLL. Examples of the present invention address this problem with the introduction of a digital IF offset, and a comparable, opposite LO frequency adjustment.

It is possible to have a fast locking PLL which can relock to new frequency in 30 us. However, an additional or alternative mechanism to achieve this is to use, say, a two-point modulation scheme, specifically used to avoid pushing/pulling/4Fmod problem. Two-point modulation is a well known approach to perform modulation in constant envelope transmitters, such as Bluetooth™ and GSM™. In this approach, examples propose using a two-point modulator to quickly translate the LO to a new frequency within a few nanoseconds (ns) of applying the digital control input.

The first point of the two-point modulation is applied at a digitally controlled oscillator (DCO) input (point 'A') 724. The second point of the two-point modulation is applied at the input (point 'B') 706 to sigma-delta modulator 708 and thereafter MMD 710.

In this example, a time to digital converter (TDC) 712 is used. The TDC 712 is a device for recognizing events and providing a digital representation of the time when they occurred. For example, a TDC 712 might output the time of arrival for each incoming pulse. In one example, a straight-forward way to calibrate the frequency band being used in the charge pump/frequency generation circuit is by racing two counters, one counter clocked with the reference clock 711 and the other counter clocked with the feedback clock 713 that is the frequency divided version of the output of the DCO 720. The frequency division occurs in a block called a multi-modulus divider (MMD) 710. The counters in the TDC 712 are forced to start at the same time and permitted to count up to a predetermined value. In this manner, it can be interpreted that whichever counter gets to the value first received the clock that was greater in frequency.

When the PLL is locked, the loop filter has stable output and the PLL is oscillating at one point. By applying an input at point 'A' 724, it is possible to move the DCO 720 (or VCO) output by an offset. This is noticed by the digital loop filter 716 arranged to receive the output from the TDC 712. The DCO (or VCO) attempts to correct the offset and settle to a new value such that the DCO 720 (VCO) comes back to original point. However, to avoid this happening, the illustrated example applies the same offset in MMD 710 so that the loop filter does not see any perturbation. The two signals are applied simultaneously as the open loop response of VCO is a few ns. This way, the PLL stays locked and it is possible to move the output frequency in open loop manner by applying the same input at point 'A' 724 and point 'B' 706. Hence, the PLL does not need to relock or settle. Hence, the LO frequency can be translated instantaneously as this translation is not visible to the PLL; therefore no transients are created.

Since the frequency offset is applied at point 'A' 724 and point 'B' 706 and will translate the LO by Δf, the opposite must be done at the input in the digital baseband (DBB) at point 'D' 736 (or in the Digital Front End in other examples, but not both), as the PA output needs to remain at the same frequency.

When the output power is increased to maximum and its vicinity (e.g. Pmax-3 dB), frequency pushing occurs under specific conditions when there are RBs that are close to the PLL BW. Any error between the two signals at point 'A' 724 and point 'B' 706 will typically be due to any inaccuracy of the Kdco estimate. The Kdco is estimate is performed through calibration by setting the frequency input in one direction and measuring the output frequency of DCO 720. The frequency input is then set in the opposite direction and the output frequency of DCO 720 re-measured. The average of the two frequency measurements provides an estimate of Kdco. Thus, if there is an error, the two signals at point 'A' 724 and point 'B' 706 will not exactly match and the mismatch will be observed at point 'C' 716, i.e. the signal at point 'C' 710 will deviate from the steady state value. A controller, such as controller 308, observing the signal deviation at point 'C' 710 can calculate its variance, either in the time domain or using FFT module 726 as shown, and signal to the pull-mitigation module 704 that the PLL is close to potentially falling out of lock. Hence, this operation creates a pushing/pulling detection mechanism.

Therefore, in this example, the signal at point 'C' 716, i.e. showing that the Kdco estimate is in error, is passed to a Fast Fourier Transform (FFT) module 726. The output 728 of FFT module 726 provides a residual pulling input to pull-mitigation module 704 and is then used to adapt the estimate and measure the signal at point 'C' 716 again once an adjustment has been made. In this manner, the error due to the Kdco estimate inaccuracy is successively reduced or minimized. This is particularly the case when there is no pushing or pulling, i.e. when the output power is low enough that pushing/pulling is not a concern and the error is mostly contributed by Kdco estimate calibration error.

The FFT of the error signal at the output 710 of the TDC 712 exhibits a frequency domain distribution of error power. In the time domain, the variance of this signal can be measured. Under steady-state conditions, for example when the PLL is settled and no pushing or pulling is exhibited, the time domain variance will settle to a less than a nominal value. As the DCO 720 is pushed due to supply voltage variation, the error signal variation will increase and indicate that the PLL is trying to combat frequency pushing or pulling. This is an indicator of the quality of the selection of IF frequency translation, as well as an indication that the Kdco estimate is still accurate.

If it is determined that the IF frequency is large, and the RBs are placed at an offset that is far away from the loop BW of the PLL, and pulling is not an issue, or, if the output power is low enough that pulling is not an issue, then the variance of the error signal at the output 710 of the TDC 712 will increase as the Kdco estimate becomes obsolete, i.e. the Kdco estimate of the DCO 720 changes over time. However, if the Kdco estimate is good, i.e. the error signal variance is small in the absence of pulling and PA output power in brought closer to Pmax, then in some examples it can be inferred that the PLL is trying to combat frequency pushing or pulling. In this case, this measure is used to evaluate whether IF frequency translation should be increased to assist the PLL.

Thus, in some examples, the use of the FFT module 726 is an alternative way of evaluating the phase error signal. The total power of the signal remains the same, in both the time and frequency domain. Hence, in some examples, the FFT module 726 may be used just as a time domain power estimate (for example estimating a variance of an error signal in a window). However, the FFT module 726 may also provide a further insight into the frequency components of the error signal power.

For example, if the power at higher frequencies is evaluated to be larger, the DCO 720 may be understood as being aggressed by significant pushing or pulling. However, if most power resides in the lower frequencies, this would imply that PLL is likely able to combat the aggressing signal as the digital loop filter 716 can settle it out.

In other examples, in contrast to employing two-point modulation, it is envisaged that single point modulation may be used, whereby the frequency input may be applied at point 'B' 706 only (i.e. the value at point 'A' 724 is set to '0'). In this case, the loop filter will attenuate the input and, therefore, point 'B' 706 must be pre-emphasised by the inverse of this shaping filter response, for example within pull-mitigation module 704.

Thus, examples of the aforementioned inventive concept provide a mechanism to determine an acceptable, and in some instances the best, frequency offset (FO) for a VCO or DCO frequency, for example with respect to an output power level of a power amplifier (PA) coupled to the frequency generation circuit. Examples of the invention may be used to determine how far the RBs should be placed for the PLL not to be affected by the RBs, for example when operating at a maximum output power (Pmax).

Although examples of the invention are described with reference to avoiding causing 4Fmod interference into an adjacent frequency band, it is envisaged that other examples may be employed to avoid causing interference with other intermodulation products of odd harmonics. Some examples of the invention avoid a need to implement a harmonic rejection mixer and associated LO phase shifting circuits. In this manner, examples of the invention may facilitate a reduced die area (circuit area) and/or current consumption. Some examples of the invention may also reduce the VCO's sensitivity to pulling or simplification of the offset selection to a maximum frequency separation between the LO and PA output, if the 4Fmod problem is addressed by use of a harmonic reject mixer.

There are many possible solutions of how much the frequency may be translated by in accordance with examples of the invention. For example, if Fmin is the minimum frequency separation that maintains a steady-state PLL, even at a maximum output power (Pmax), Fmin may be chosen to be a standard translation factor. This is the other extreme case compared to the previous example that always chose a maximum translation to locate the RBs as far away as possible from the LO frequency.

In some examples, if any of the frequency selections regarding avoiding the 4Fmod frequency do not work, these can be discovered by monitoring point 'C' 710, for example as shown by controller 308. For example, the monitoring at point 'C' 710 may determine that there is more variation when pushing/pulling happens, due to the PLL attempting to combat the aggressor, and the error goes up and down trying to adapt the frequency of the DCO 720 to stay at one frequency. Hence, by monitoring the residual pulling output 728 of the FFT module 726, the phase error (PHE) may be used to determine if PLL maintains lock and selections are working well. In this manner, following a careful selection of the offset frequency employed, the 4Fmod problem may be simultaneously avoided. In some cases, PLL BW may be momentarily increased to combat frequency pushing or pulling whilst adequate separation of LO and PA output center frequency solves any pushing/pulling problem. In some examples, this may be useful when adapting the transmitter to operate as a zero-IF transmitter with a higher number of RBs, some of which are located at the edge of the PLL BW. In some examples, such a second IF translation in order to combat pushing may be embedded in a digital baseband IC (DBB IC) (not shown) coupled to the RFIC.

Figure 8:
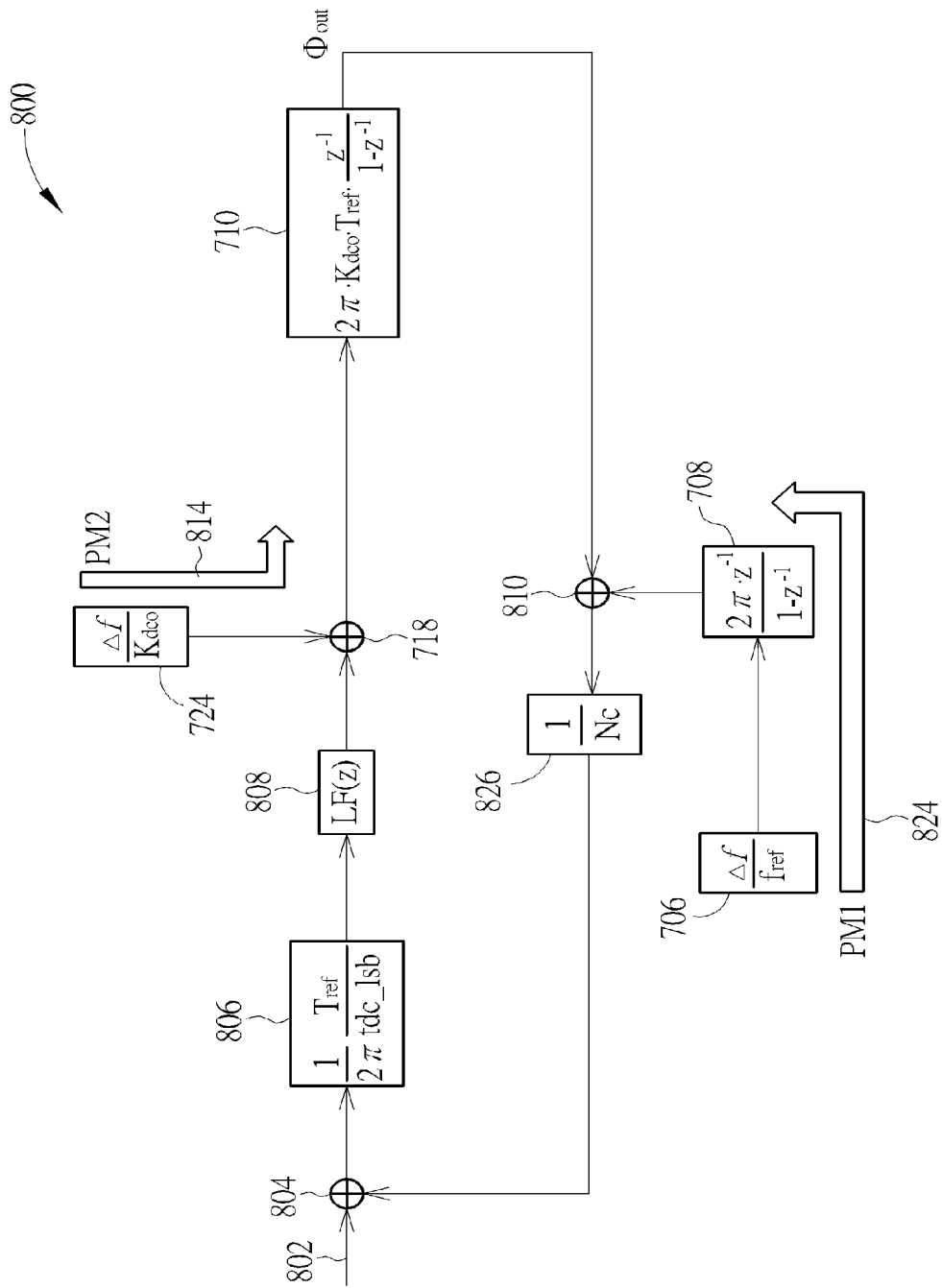
FIG. 8 illustrates an example block diagram or a 2-point modulation scheme according to examples of the present invention.

Referring now to FIG. 8, an example block diagram 800 of a 2-point modulation scheme is illustrated according to examples of the present invention. FIG. 8 explains the two point modulation as a baseband equivalent phase domain model in z-domain (discrete time). The time to digital converter (e.g. TDC 712 from FIG. 7) provides a gain in 806 where the transmit frequency (Trf) is the inverse of a reference frequency (typically 26 MHz or 38.4 MHz for cellular transceivers) for the PLL. An example frequency divider is modelled in 826 as an inverse of Nc, where Nc is a divide ratio. LF(z) 808 is the loop filter which is implemented in a digital domain as a programmable low pass filter, where the PLL BW may be programmably adjusted by increasing the corner frequency of the loop filter. As mentioned, the corner frequency of loop filter 808 can be (programmably) increased in order to increase the PLL BW, albeit at the cost of more noise feeding to the following DCO 710. The DCO 710 is modelled in phase domain as an integrator with a gain (Kdco). The two point modulation is shown through paths PM1 824 and PM2 814. The desired frequency shift $\Delta f$ is achieved by adding an input $\Delta f/K_{DCO}$ to PM2 814. The balancing input is provided as PM1 824 as a normalized frequency and converted to phase through integrator 708. The only parameter dependent on analog is $K_{DCO}$ that must be tracked and re-calibrated such that the loop filter 808 does not see significant perturbation to its steady state value as PM1 824 and PM2 814 are applied. These two inputs are held at zero when frequency translation is not desired or whenever the PLL is relocked.

Figure 9:
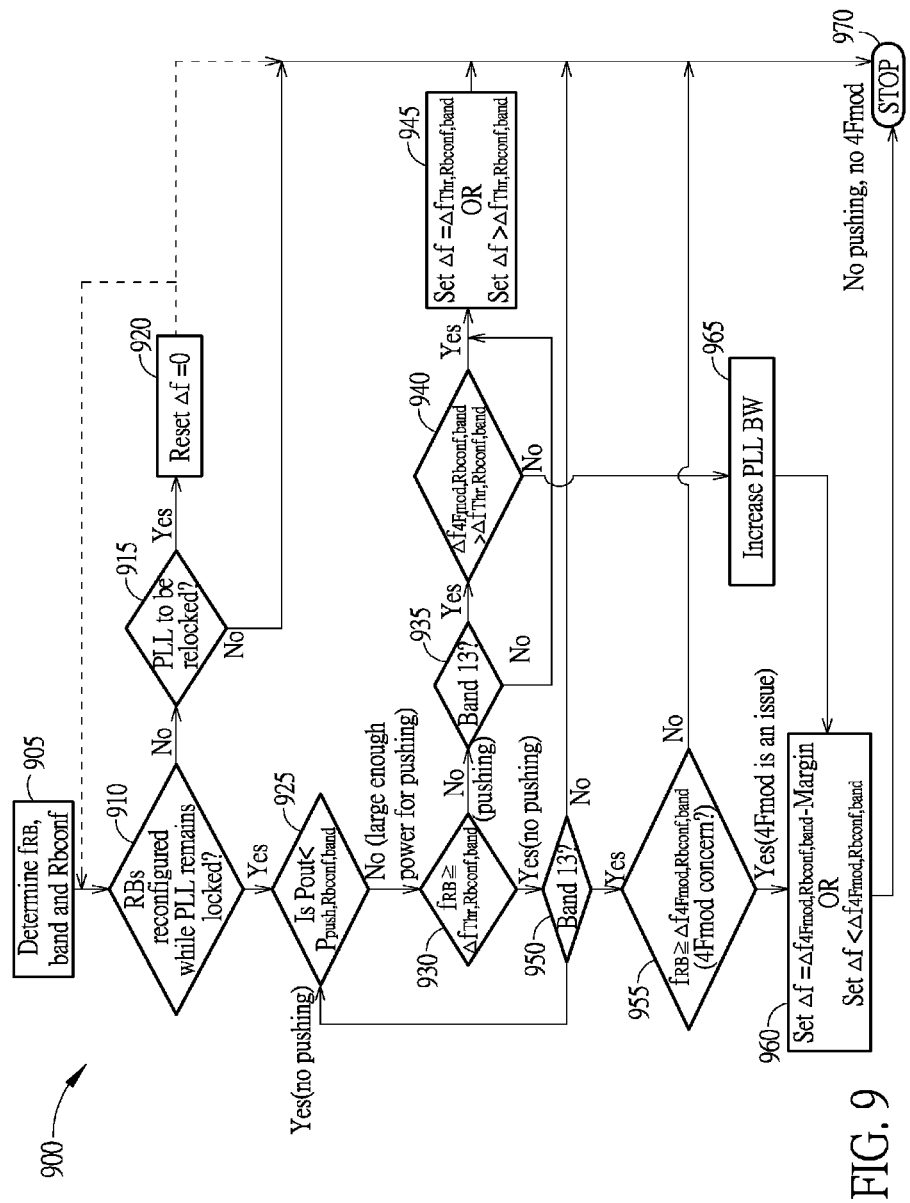
FIG. 9 illustrates an example flowchart of a frequency adjustment operation according to examples of the present invention.

FIG. 9 illustrates an example flowchart 900 of a frequency adjustment operation according to examples of the present invention. The notation used in the example flowchart 900 is described below:

RB: Radio Bearer.

Rbconf: Radio Bearer configuraton.

$P_{push,Rbconf,band}$: Power at which pushing occurs for the selected frequency 'band' and 'Rbconf'.

$\Delta f_{Thr,Rbconf,band}$: No pushing occurs beyond this frequency offset for band 'band' and 'Rbconf'.

$f_{RB}$: Difference of center frequency of RBs from LO frequency ($f_{LO}$).

$\Delta f_{4Fmod,Rbconf,band}$: Offset frequency between $f_{LO}$ and center frequency of PPA output at which 4Fmod violates spec.

$\Delta f$: Compensation applied to combat pushing and combat 4Fmod problem.

Margin: offset by which 4Fmod product is away from the PCS band.

Referring now to the example flowchart 900 of FIG. 9, whenever the RBs are to be reconfigured, a digital baseband circuit, such as, or comprising, the controller 308 of DBB circuit of FIG. 4, sends a command to an RFIC to generate at least one carrier frequency or radio bearer (RB). The controller determines, in 905, a frequency location of one or more signals output by the frequency generation circuit. In this example, the determination in 905 is a location of where the new RBs is/are to be positioned (i.e. the frequency of the radio bearer ($f_{RB}$)) and what the bandwidth (Rbconf) and band of the one or more RBs is/are. A determination is then made in 910 as to whether the one or more RBs are to be re-configured whilst the PLL remains locked. Examples of the invention comprise the controller 308 providing a control signal to frequency generation circuit to adjust the carrier frequency generated by the frequency generation circuit.

If the one or more RBs are not to be re-configured whilst the PLL is locked in 910, a determination is made as to whether the PLL is to be relocked in 915. If the PLL is not to be relocked in 915, the process ends at 970. If the PLL is to be relocked in 915, the pulling compensation $\Delta f$ value is removed and reset to zero in 920. Otherwise, it is known that output power can cause pushing for the selected band and Rbconf. In this situation, the flowchart can decide on a new pulling compensation value of $\Delta f$. The process ends at 970. In an alternative example, after the pulling compensation $\Delta f$ value is removed and reset to zero in 920, the flowchart loops to 910.

If the one or more RBs are to be re-configured whilst the PLL is locked in 910, the process moves to 925 where a determination is made as to whether the output power is less than the power ($P_{push,Rbconf,band}$) at which pushing occurs for the selected frequency 'band' and 'Rbconf'. If the output power is such that pushing is not an issue in 925, the process loops to 950 where a determination is made as to whether a 4Fmod problem, such as may arise in Band 13, needs to be resolved.

Note that VCO frequency pushing happens only above certain threshold power at which the disturbance from PA output is able to make sufficient perturbation at VCO supply to create a significant change in the output frequency. Therefore, we do not need to take any counter measure if the output power is below the threshold value where VCO output starts to shift enough to create degradation in output spectrum. Small shifts are easily dealt with by the PLL.

Therefore, if there is pushing expected or determined in 925, due to the output power being less than the power at which pushing occurs for the selected frequency 'band' and 'Rbconf' ($P_{push,Rbconf,band}$), a determination is made as to whether a difference of center frequency of RBs from LO frequency ($f_{LO}$) is greater than or equal to a frequency offset for the selected 'band' and 'Rbconf' in 930. If the difference of center frequency of RBs from the local oscillator (LO) frequency ($f_{LO}$) is greater than or equal to a frequency offset for the selected 'band' and 'Rbconf' in 930, no pushing occurs beyond this frequency offset for the selected 'band' and 'Rbconf'. The process then loops to 950 where a determination is made as to whether a 4Fmod problem, such as may arise in Band 13 of LTE™, needs to be resolved.

If the difference of center frequency of RBs from the local oscillator (LO) frequency ($f_{LO}$) is not greater than or equal to a frequency offset for the selected 'band' and 'Rbconf' in 930, and hence pushing occurs beyond this frequency offset for the selected 'band' and 'Rbconf', a determination is made as to whether or not the frequencies are located in Band 13 of LTE™ (or a future band with 4Fmod or similar problem) in 935. If the frequencies are not located in Band 13 of LTE™ (or similar) in 935, the process jumps to 945. If the frequencies are located in Band 13 of LTE™, in 935, a determination is made as to whether the offset frequency between $f_{LO}$ and center frequency of PPA output at which 4Fmod violates spec. ($\Delta f_{4Fmod,Rbconf,band}$) is greater than the frequency offset for the selected 'band' and 'Rbconf' where no pushing occurs beyond that point ($\Delta f_{Thr,Rbconf,band}$), as shown in 940. If $\Delta f_{4Fmod,Rbconf,band}$ is greater than $\Delta f_{Thr,Rbconf,band}$, then the frequency compensation $\Delta f$ is set to the smallest frequency offset where pushing is circumvented, or greater than this offset, as shown in 945. Thus, controller 308 introduces a compensating frequency offset in a baseband transmit signal in a (second) frequency direction opposite to a frequency offset applied in a (first) direction to the one or more generated carrier frequency/ies such that the PLL is able to pull the generated carrier frequency in that (first) frequency direction. The process then stops at 970.

However, if $\Delta f_{4Fmod,Rbconf,band}$ is not greater than $\Delta f_{4Fmod,Rbconf,band}$ in 940, then a 4Fmod problem is expected. In response to this, in this example, $\Delta f$ is increased as much as possible to try to help the pushing situation by opening up the PLL bandwidth in 965. The process then loops to 960.

If there is no pushing in 925 and the frequencies are not located in Band 13 in 950, nothing needs to be done. In this situation, the process stops at 970.

If there is no pushing in 925 and the frequencies are located in Band 13 in 950, a determination is made as to whether the difference of center frequency of RBs from LO frequency ($f_{LO}$) is much greater than the $\Delta f_{4Fmod,Rbconf,band}$, thereby leading to a potential 4Fmod concern in 955. If there is no 4Fmod concern in 955, the process stops at 970. However, if there is a 4Fmod concern in 955 a compensation ($\Delta f$) is applied to combat pushing and combat 4Fmod problem. In some examples, the compensation ($\Delta f$) may be such that the largest frequency that avoids 4Fmod problem is selected, as in 960. Alternatively, the controller 308 may choose to operate a zero-IF transmitter and let the PLL combat any pulling depending on the situation at hand. It is envisaged that many other operational choices are available and may be employed by a skilled person. However, some examples of the invention adopt the approach to configure $\Delta f$ such that either $f_{LO}$ and PPA output center frequency are exactly the same, or they are more than $\Delta f_{Thr,Rbconf,band}$ apart.

In the forgoing specification, an invention has been described with reference to specific illustrated examples. It will, however, be evident that various modifications and changes may be made therein without departing from the scope of the invention as set forth in the appended claims.

The connections as discussed herein may be any type of connections suitable to transfer signals from or to the respective nodes, units or devices, for example via intermediary components. Accordingly, unless implied or stated otherwise, the connections may for example be direct connections or indirect connections. The connections may be illustrated or described in reference to being a single connection, a plurality of connections, unidirectional connections or bidirectional connections. However, different illustrated examples may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively 'associated such that the desired functionality is achieved. Hence, any two components herein combined to achieve a particular functionality can be 'associated with' each other such that the desired functionality is achieved, irrespective of architectures or intermediary components. Likewise, two components so associated can also be viewed as being 'operably connected', or 'operably coupled' to each other to achieve the desired functionality.

Furthermore, those skilled in the art will recognise that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Furthermore, the illustrated examples may be implemented as circuitry located in a single integrated circuit or within the same device. Alternatively, the illustrated examples may be implemented as any number of separate integrated circuits or separate devices interconnected with each other in a suitable manner. However, other modifications, variations and alternatives are also possible. The specifications and drawings are, accordingly, to be regarded in an illustrative rather than in a restrictive sense.

It will be appreciated that, for clarity purposes, the above description has described embodiments of the invention with reference to different functional units and processors. However, it will be apparent that any suitable distribution of functionality between different functional units or processors, for example with respect to the charge pump circuitry or switching elements may be used without detracting from the invention. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term 'comprising' does not exclude the presence of other elements or steps.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second', etc. do not preclude a plurality.

Thus, an improved wireless communication unit, circuit, for example one used in a charge pump circuit, and method for adjusting a frequency, have been described, wherein the aforementioned disadvantages with prior art arrangements have been substantially alleviated.

What is claimed is:

1. A circuit for a wireless communication unit that includes a transmitter for use in a wireless communication system, the circuit comprising:
   a frequency generation circuit comprising a phase locked loop, PLL, arranged to generate a carrier frequency; and
   a controller operably coupled to the frequency generation circuit and arranged to determine a frequency of one or more signals output by the frequency generation circuit and provide a control signal thereto to adjust the carrier frequency generated by the frequency generation circuit;
   wherein the adjusted carrier frequency includes a frequency offset in a first frequency direction selected by the controller, and the controller is arranged to
      provide digital signals to introduce a selected compensating frequency offset in a baseband transmit signal in a second frequency direction opposite to the first frequency direction.

2. The circuit of claim 1 wherein the circuit comprises a baseband circuit operably coupled to the controller and the baseband transmit signal is a digital baseband transmit signal and the controller introduces the frequency offset in the generated carrier frequency by sending a digital control signal to the frequency generation circuit.

3. The circuit of claim 1 wherein the controller determines the frequency offset in the generated carrier frequency based on at least one of: output power level of a transmit signal, a knowledge of how far the PLL is able to pull the generated carrier frequency.

4. The circuit of claim 3 wherein the controller introduces a frequency offset that is substantially a smallest offset that can be tolerated such that the PLL is able to pull the carrier frequency plus offset and still reduce interference into an adjacent frequency band.

5. The circuit of claim 4 wherein the introduced frequency offset is selected by the controller to perform at least one of: reduce 4Fmod interference to an acceptable power level by selecting an adjacent frequency band for the carrier frequency, move 4Fmod interference in-band of the frequency generation circuit.

6. The circuit of claim 5 wherein the introduced frequency offset is selected by the controller to reduce 4Fmod interference in Band 13 of LTE™ to an acceptable power level by selecting an adjacent frequency band for the carrier frequency.

7. The circuit of claim 1 wherein the controller is further arranged to determine whether a difference of a center frequency of the generated carrier frequency is less than the introduced frequency offset for a selected band and configured radio bearer such that pushing occurs.

8. The circuit of claim 1 wherein the controller comprises a fast fourier transform function arranged to evaluate a phase error signal of the PLL in at least one of a time domain, a frequency domain.

9. The circuit of claim 8 wherein the controller is arranged to relocate at least one radio bearer based on the evaluated phase error signal.

10. The circuit of claim 1 wherein the controller is arranged to:
determine a location of a plurality of frequencies generated by the frequency generation circuit;
determine one or more frequencies, from the plurality of frequencies, where pushing occurs; and, in response thereto
cause an adjustment of the generated one or more frequencies to a higher frequency than the generated carrier frequency with a frequency offset.

11. The circuit of claim 1 wherein the controller is configured to translate a baseband spectrum to an intermediate frequency, IF, to introduce the compensating frequency offset, whilst applying a frequency offset to shift the generated carrier frequency in an opposite direction by the same IF.

12. The circuit of claim 1 wherein the controller is configured to introduce a frequency offset in the generated carrier frequency in a first frequency direction by use of two-point modulation.

13. The circuit of claim 12 wherein the frequency generation circuit comprises a digitally controlled oscillator, DCO, and the frequency generation circuit further comprises a sigma-delta modulator, such that a first point of the two-point modulation is applied at a DCO input and a second point of the two-point modulation is applied at an input of the sigma-delta modulator.

14. The circuit of claim 1 wherein the frequency generation circuit further comprises a fast fourier transform, FFT, module operably coupled to the PLL and configured to evaluate a phase error signal within the PLL.

15. The circuit of claim 14 wherein the FFT module is configured as a time domain power estimate to estimate a variance of an error signal in a time window of a signal applied to the FFT module.

16. The circuit of claim 14 wherein the FFT module is configured to provide an indication of error signal power of frequency components of signals contained within the PLL.

17. The circuit of claim 1 wherein the controller is configured to introduce a frequency offset in the generated carrier frequency in a first frequency direction by use of one-point modulation by applying a frequency input to a sigma delta modulator located within the PLL.

18. A wireless communication unit comprising:
a frequency generation circuit comprising a phase locked loop, PLL, and arranged to generate a carrier frequency; and
a controller operably coupled to the frequency generation circuit and arranged to determine a frequency of one or more signals output by the frequency generation circuit and provide a control signal thereto to adjust the carrier frequency generated by the frequency generation circuit;
wherein the adjusted carrier frequency includes a frequency offset in a first frequency direction selected by the controller, and the controller is arranged to
provide digital signals to introduce a selected compensating frequency offset in a baseband transmit signal in a second frequency direction opposite to the first frequency direction.

19. A method for frequency generation by a frequency generation circuit of a wireless communication unit that includes a transmitter for use in a wireless communication system comprising a phase locked loop, PLL; the method comprising:
generating a carrier frequency;
determining a frequency of one or more signals output by the frequency generation circuit;
providing a control signal to the frequency generation circuit to adjust the carrier frequency generated by the frequency generation circuit, wherein the adjusted carrier frequency includes a selected frequency offset in a first frequency direction; and
providing digital signals to introduce a selected compensating frequency offset in a baseband transmit signal in a second frequency direction opposite to the first frequency direction.

* * * * *